United States Patent
Rahn et al.

(10) Patent No.: US 8,645,788 B2
(45) Date of Patent: Feb. 4, 2014

(54) FORWARD ERROR CORRECTION (FEC) CONVERGENCE BY CONTROLLING RELIABILITY LEVELS OF DECODED WORDS IN A SOFT FEC DECODER

(75) Inventors: Jeffrey T. Rahn, Sunnyvale, CA (US); Han Henry Sun, Ottawa (CA); Stanley H. Blakey, Kanata (CA)

(73) Assignee: Infinera Corporation, Sunnyvale, CA (US)

( * ) Notice: Subject to any disclaimer, the term of this patent is extended or adjusted under 35 U.S.C. 154(b) by 148 days.

(21) Appl. No.: 13/341,226

(22) Filed: Dec. 30, 2011

(65) Prior Publication Data

US 2013/0173984 A1  Jul. 4, 2013

(51) Int. Cl.
H03M 13/00 (2006.01)
H03M 13/03 (2006.01)
G06F 7/02 (2006.01)
H04B 17/00 (2006.01)
H04N 7/12 (2006.01)

(52) U.S. Cl.
USPC ........... 714/752; 714/755; 714/760; 714/781; 714/786; 714/799; 714/821; 375/224; 375/240.27

(58) Field of Classification Search
USPC ......... 714/752, 755, 760, 781, 786, 799, 821; 375/224, 240.27
See application file for complete search history.

(56) References Cited

U.S. PATENT DOCUMENTS

| | | | | |
|---|---|---|---|---|
| 5,621,764 | A * | 4/1997 | Ushirokawa et al. | 375/317 |
| 6,017,146 | A * | 1/2000 | Masumoto et al. | 714/780 |
| 6,732,321 | B2 * | 5/2004 | Classon et al. | 714/774 |
| 7,424,072 | B2 * | 9/2008 | Hayashi et al. | 375/346 |
| 7,584,401 | B2 * | 9/2009 | Hong et al. | 714/755 |
| 7,653,162 | B2 * | 1/2010 | Hayashi et al. | 375/346 |
| 7,702,050 | B2 * | 4/2010 | Su | 375/347 |
| 7,716,561 | B2 * | 5/2010 | Belogolovyi et al. | 714/780 |
| 7,836,383 | B2 * | 11/2010 | Efimov et al. | 714/780 |
| 8,209,579 | B2 * | 6/2012 | Belogolovy | 714/752 |
| 8,300,747 | B2 * | 10/2012 | Su | 375/347 |
| 2002/0136318 | A1 * | 9/2002 | Gorokhov et al. | 375/261 |
| 2004/0229581 | A1 * | 11/2004 | Mizoguchi et al. | 455/136 |
| 2010/0223524 | A1 * | 9/2010 | Duggan et al. | 714/751 |
| 2012/0297267 | A1 * | 11/2012 | Chinnici et al. | 714/755 |

OTHER PUBLICATIONS

Ramesh Mahendra Pyndiah, "Near-Optimum Decoding of Product Codes: Block Turbo Codes", Aug. 1998, IEEE Transactions on Communications, vol. 46, No. 8, pp. 1003-1010.
Euclidean Distance, http://en.wikipedia.org/wiki/Euclidean_distance, 3 pages, modified Dec. 2, 2011, print date: Dec. 30, 2011.

* cited by examiner

*Primary Examiner* — John J Tabone, Jr.
(74) *Attorney, Agent, or Firm* — Harrity & Harrity LLP; David L. Soltz

(57) ABSTRACT

A system receives a first word on which to perform error correction; identifies combinations in which encoded bits, within the first word, can be inverted; generates candidate words based on the first word and the combinations; decodes the candidate words; determines distances between the decoded words and the first word; selects, as a second word, one of the decoded words associated with a shortest distance; compares the second word to the first word to identify errors within the first word; generates a value to cause a reliability level of the first word to increase when a quantity of the errors is less than a threshold; generates another value to cause a reliability level of the first word to decrease when the quantity of the errors is not less than the threshold; and outputs a third word based on the first word, and the value or the other value.

25 Claims, 7 Drawing Sheets

FORWARD ERROR CORRECTION (FEC) CONVERGENCE BY CONTROLLING RELIABILITY LEVELS OF DECODED WORDS IN A SOFT FEC DECODER

BACKGROUND

In an increasingly networked world, more and more traffic, such as data, voice, and video, is transmitted over public and proprietary networks. The networks use high data rates (e.g., greater than 10 gigabits per second (Gbps)) to transport greater quantities of traffic. Certain types of the networks, such as optical networks, use complex signal processing to achieve the high data rates. The complex signal processing may be performed using forward error correction (FEC) devices, such as iterative soft decoders, that use soft iterative error correction techniques to reduce a quantity of errors, within the traffic, to a level that is specified by the public and proprietary networks. Unfortunately, certain error patterns associated with the traffic (e.g., an error burst, an error density that is greater than a threshold, a grid lock error condition, etc.) can cause FEC devices to fail. The failure of the FEC devices may cause the errors, within the traffic, to not be corrected. The failure of the FEC devices may also cause the quantity of errors, within the traffic, to increase to a level that is greater than the level that is specified by the public and proprietary networks, which may cause a disruption of service and/or a reduction in the quality of service received by a client device.

SUMMARY

According to one implementation, a system may include a storage device to store a block of words that are generated as a result of a first iteration of an error correction operation, where each word of the block of words may include respective encoded bits and respective sets of reliability bits for identifying a respective level of reliability of each one of the respective encoded bits. The system may also include one or more devices to receive a first word, of the block of words, for initiating a second iteration of the error correction operation; identify different combinations in which a portion of encoded bits, included in the first word, can be inverted to create different combinations of inverted encoded bits; generate candidate words based on the different combinations of inverted encoded bits; decode the candidate words to create decoded words; compare the decoded words to the first word to determine distances between the decoded words and the first word; and select, as a second word, one of the decoded words associated with a shortest one of the distances. The system may also include the one or more devices to compare the second word to the first word to identify a quantity of errors associated with the first word; generate a first modification value to cause a level of reliability, of the first word, to increase when the quantity of errors is less than a threshold; generate a second modification value to cause a level of reliability, of the first word, to decrease when the quantity of errors is not less than the threshold; and output a third word based on the first word and based on the first modification value or the second modification value.

According to another implementation, a method may include receiving, from an optical receiver and by a device, a group of words, each word of the group of words including a group of samples, where each sample of the group of samples may include a corresponding one of a group of encoded bits, and respective reliability bits for identifying a respective level of reliability of the corresponding one of the group of encoded bits. The method may also include identifying, by the device and within a first word of the group of words, a set of least reliable encoded bits that include levels of reliability that are less than a reliability threshold, where the first word includes different versions with different combinations of inverted bits within the set of least reliable encoded bits; generating, by the device, a set of candidate words based on different versions of the first word; decoding, by the device, the set of candidate words to create a set of decoded words; comparing, by the device, the set of decoded words to the first word to identify measures of similarity between the set of decoded words and the first word; and selecting, by the device and as a second word, one of the set of decoded words that includes a greatest measure of similarity among the identified measures of similarity. The method may further include identifying a quantity of errors, associated with the first word, based on the comparison of the second word to the first word; determining, by the device, whether the quantity of errors is greater than a threshold; outputting, by the device, a third word based on a first version of the first word that includes a higher level of reliability than the first word when the quantity of errors is not greater than the threshold; or outputting, by the device, a fourth word based on a second version of the first word that includes a lower level of reliability than the first word when the quantity of errors is greater than the threshold.

According to a further implementation, a device may include a memory to store a block of words that are generated as a result of a one or more iterations associated with an error correction operation, where each word of the block of words, may include respective encoded bits and respective sets of reliability bits that identify a respective level of reliability for each one of the respective encoded bits. The device may also include one or more components to receive an instruction to perform an another iteration associated with the error correction operation; obtain, in response to the instruction, a first word, from the block of words, associated with a previous one of the one or more iterations; process the first word, to create one or more decoded versions of the first word, where measures of similarity, between the first word and one or more decoded versions of the first word, are provided; and select, as a second word, one of the one or more decoded versions of the first word associated with a highest one of the measures of similarity. The device may also include the one or more components to determine a quantity of errors within the first word based on a comparison of the first word to the second word; determine whether the quantity of errors is greater than a threshold; generate, based on the first word, a third word when the quantity of errors is not greater than the threshold, where the third word may include a first set of bits, each having a level of reliability that is greater than or equal to a corresponding one of a second set of bits within the first word; generate, based on the first word, a fourth word when the quantity of errors is greater than the threshold, where the fourth word may include a third set of bits, each having a lower level of reliability than the corresponding one of the second set of bits; and output the third word or the fourth word based on whether the quantity of errors is greater than the threshold.

DETAILED DESCRIPTION

The following detailed description refers to the accompanying drawings. The same reference numbers in different drawings may identify the same or similar elements.

A system and/or method, described herein, may allow a forward error correction (FEC) device to perform an error correction operation, on traffic received from a receiver, using an iterative soft decoding technique that allows errors, within the traffic, to be corrected. The FEC device may perform the iterative soft decoding technique in a manner that includes dynamically controlling a level of reliability of bits, associated with the traffic, to correct errors and/or to remedy an error condition without causing the FEC device to fail. Correcting errors and/or remedying the error condition, without causing the FEC device to fail, may allow a service disruption to be avoided and/or a particular quality of service, greater than a threshold, to be received by a client device.

Figure 1:
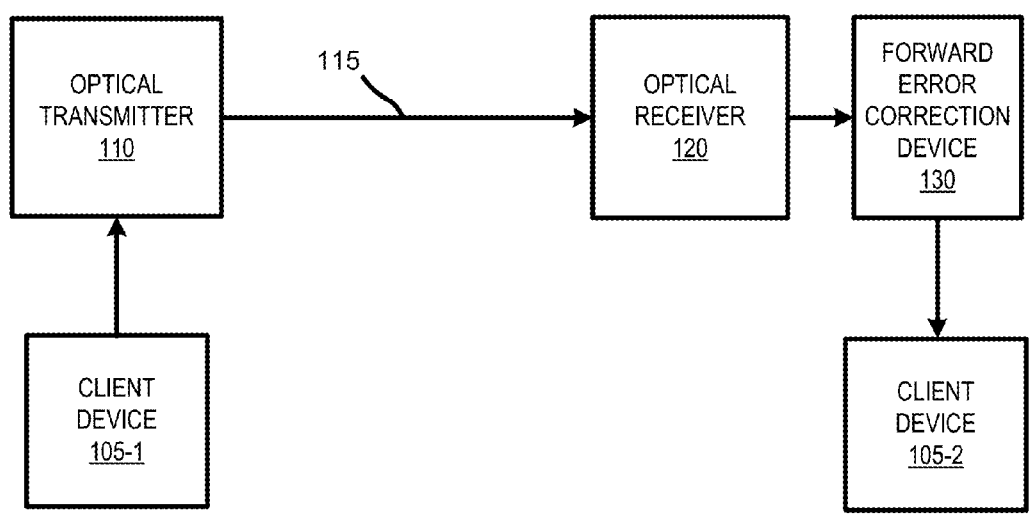
FIG. 1 is a diagram of an example network in which systems and/or methods described herein may be implemented.

FIG. 1 is a diagram of an example network 100 in which systems and/or methods described herein may be implemented. Network 100 may include a pair of client devices 105-1 and 105-2, an optical transmitter 110, a link 115, an optical receiver 120, and a forward error correction (FEC) device 130. The number of devices, illustrated in FIG. 1, is provided for explanatory purposes. In practice, there may be additional devices, fewer devices, different devices, or differently arranged devices than illustrated in FIG. 1. Also, in some implementations, one or more of the devices of network 100 may perform one or more functions described as being performed by another one or more of the devices of network 100. For example, functions performed by FEC device 130 could be performed by optical receiver 120 instead of, or in combination with, by some other device.

Client device 105 may include a computation or communication device that is capable of communicating with optical transmitter 110, optical receiver 120, and/or FEC device 130. For example, client device 105 may include a radiotelephone, a personal communications system (PCS) terminal (e.g., that may combine a cellular radiotelephone with data processing and data communications capabilities), a personal digital assistant (PDA) (e.g., that can include a radiotelephone, a pager, Internet/intranet access, etc.), a server device, a laptop computer, a tablet computer, a set top box, a digital video recorder (DVR), a personal gaming system, a smart phone, or another type of computation or communication device.

Client device 105-1 may, for example, communicate with a forward error correction component within optical transmitter 110. Client device 105-1 may transmit a client signal that includes a steam of packets that carry payload (e.g., a message, video, audio, a document, etc.), associated with client device 105-1. Alternatively, or additionally, client device 105-2 may communicate with FEC device 130 to receive the client signal that has been processed, by transmitter 120 and/or FEC device 130, to detect and/or correct errors within the client signal. Client device 105-2 may receive the client signal directly from FEC device 130 and/or indirectly from FEC device 130 via optical receiver 120).

Optical transmitter 110 may include one or more devices that generate and/or transmit an optical signal to optical receiver 120. Optical transmitter 110 may, in an example implementation, include one or more lasers that generate one or more optical signals. Alternatively, or additionally, optical transmitter 110 may include a modulator that modulates the one or more optical signals based on one or more input electrical signals, such as client signals received from client devices. In this example, optical transmitter 110 may modulate the optical signals using one or more modulation techniques (e.g., based on phase modulation, frequency modulation, amplitude modulation, polarization modulation, and/or other modulation techniques).

Alternatively, or additionally, optical transmitter 110 may include an encoding device that encodes payload bits that are included within a client signal received from client device 105. Optical transmitter 110 may encode the payload bits using a forward error correction code (e.g., a Bose, Ray-Chaudhuri (BCH) code, and/or some other type of error correction code). Optical transmitter 110 may encode the payload bits as a block and/or a frame of a fixed quantity of payload bits to be describe in greater detail below with respect to FIG. 3. Optical transmitter 110 may iteratively encode horizontal and/or vertical rows of payload bits within the block. Each encoded row may include encoded payload bits (hereinafter referred to as "product codes") and error identification and/or correction bits associated with the product codes within the rows. Each encoded column may include product codes and error identification and/or correction bits associated with product codes within the columns.

Alternatively, or additionally, optical transmitter 110 may include a multiplexer to multiplex the modulated optical signals (e.g., using wavelength-division multiplexing (WDM)) into an optical signal, associated with different wavelengths, for transmission to optical receiver 120.

Link 115 may include one or more devices to allow an optical signal to be transported to optical receiver 130. Link 115 may, in an example implementation, include one or more optical fibers and/or fiber optic cables that allows the optical signal to be transported from optical transmitter 110 to optical receiver 120 without allows signal strength to decrease to a level that is less than a threshold. Additionally, or alternatively, link 115 may include one or more transmission spans, each span including a segment of the optical fibers and/or fiber optic cables. Additionally, or alternatively, link 115 may include one or more optical amplifiers to amplify the optical signal (e.g., between spans) to increase the signal strength to a level that is greater than the threshold. Additionally, or alternatively, link 115 may include one or more multiplexers (e.g., a reconfiguration add-drop (ROAD) multiplexer, etc.) to multiplex optical signals and/or to add or drop optical signals, and/or one or more demultiplexers to demultiplex optical signals, etc.

Optical receiver 120 may include one or more devices that receive, convert, process, amplify, and/or demodulate optical and/or electrical signals in a manner described herein. Optical receiver 120, in one implementation, may include one or more polarization beam splitting (PBS) devices that split the optical signal into one or more optical signals associated with different polarizations (e.g., a transverse magnetic (TM) polarization, a transverse electric (TE) polarization, etc.). Alternatively, or additionally, optical receiver 120 may include a demultiplexer device that demultiplexes a multi-wavelength optical signal (e.g., using wavelength-division demultiplexing techniques), received from optical transmitter 110, into multiple optical signals associated with different wavelengths. Alternatively, or additionally, optical receiver 120 may include an analog-to-digital converter to convert analog signals from the input to digital signals, while preserving enough analog information to allow the reliability of the signal to be estimated. Alternatively, or additionally, optical receiver 120 may include one or more demodulators that convert the optical signals into electrical signals on which optical receiver 120 can perform signal processing.

Optical receiver 120, in one example, may include a signal processing device that processes an electrical signal by inserting reliability bits into a stream associated with a product code (e.g., that include encoded payload bits and/or bits associated with error identification and/or correction), included within the electrical signal, to create a stream of samples. Optical receiver 120 may generate one or more reliability bits, associated with each bit location in the product code, based on a determination of a level of reliability associated with the signal.

Optical receiver 120 may, for example, determine that an amplitude (e.g., that indicates a power level, a voltage level, etc.), is associated with a bit within a product code. Optical receiver 120 may, for example, determine that the amplitude is greater than a first threshold (e.g., +1 volt, +3 volts, etc.). Based on the determination that the amplitude is greater than the first threshold, optical receiver 120 may insert, into a sample corresponding to the bit in the product code, reliability bits associated with a highest level of reliability (e.g., a reliability value of +3 or some other reliability value) for a bit likely to be a logical mark associated with a first value (e.g., a value of 1 or some other first value). The reliability bits may, for example, be encoded in two's complement notation as (0, 1, 1, where the left-most bit (0) represents the positive sign of the reliability value and the other bits (1, 1) represent the reliability value of 3).

Alternatively, or additionally, optical receiver 120 may determine that the amplitude is less than a second threshold (e.g., −1 volt, −3 volts, etc.). Based on the determination that the amplitude is less than the second threshold, optical receiver 120 may insert, into a sample corresponding to the bit in the product code, reliability bits that correspond to the highest level of reliability (e.g., represented by a reliability value of −3 or some other reliability value) for a bit likely to have been transmitted as a logical space associated with a second value (e.g., a value of 0 or some other second value). The reliability bits may, in this example, be encoded in two's complement notation as (1, 0, 1, where left-most bit (1) represents the negative sign of the reliability value and the other bits (0, 1) represent the reliability value).

Alternatively, or additionally, optical receiver 120 may determine that the amplitude, is less than a third threshold (e.g., 0.25 volts, or some other value) and is greater than a fourth threshold (e.g., −0.25 volts, or some other value). Based on the amplitude being less than the third threshold and greater than the fourth threshold, optical receiver 120 may insert, into a sample corresponding to the bit in the product code, reliability bits that correspond to a lowest level of reliability (e.g., a reliability value of 0 or some other value). The reliability bits may, in this example, be encoded in two's complement notation as (0, 0, 0).

Optical receiver 120 may insert other samples, associated with a bit in a product code, associated with decreasing levels of reliability (e.g., +2, +1, etc.), for positive amplitudes that are less than the first threshold and greater than the third threshold. Additionally, or alternatively, optical receiver 120 may insert other samples, associated with a bit in a product code, associated with decreasing levels of reliability (e.g., −2, −1, etc.), for negative amplitudes that are greater than the second threshold and less than the fourth threshold. Optical receiver 120 may output, to FEC device 130, an electrical signal that includes the stream of samples, associated with bits in a product code, that correspond to their respective reliability.

FEC device 130 may include one or more devices that receive, process, and/or perform other operations on the electrical signals, received from optical receiver 120, in a manner described herein. FEC device 130 may receive electrical signals from optical receiver 120 and may perform a FEC operation on the electrical signal to identify and/or correct errors within the electrical signal and/or to remedy a condition, associated with the electrical signal, caused by the identified errors.

Figure 2:
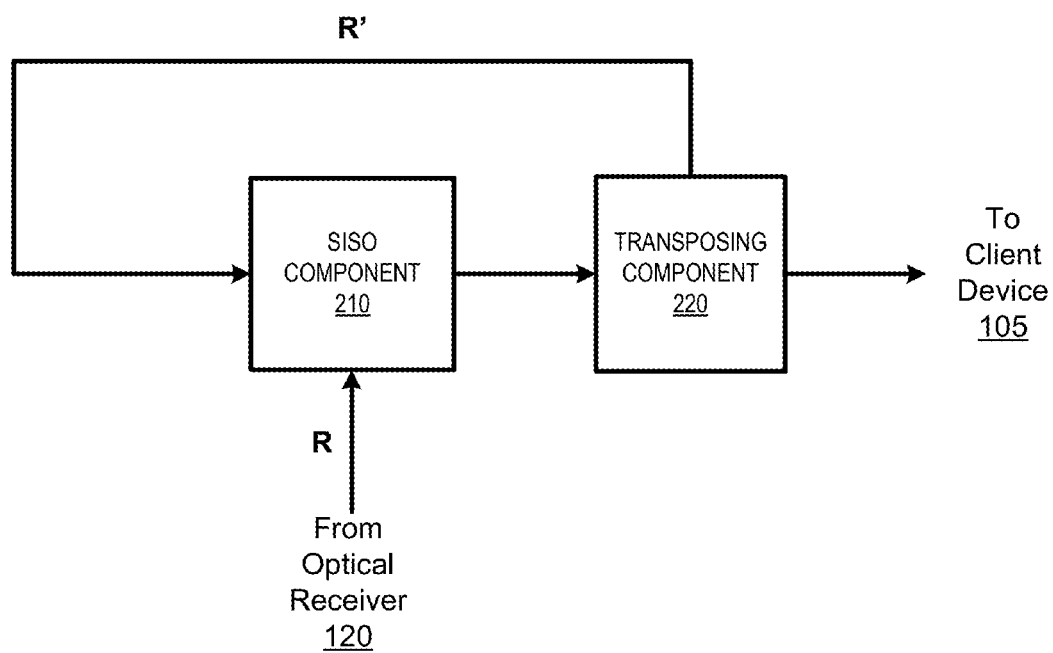
FIG. 2 is a diagram of example components of an error correction device of FIG. 1.

FIG. 2 is a diagram of example components of FEC device 130. As illustrated in FIG. 2, FEC device 130 may include a collection of components, such as a soft-input-soft-output (SISO) component 210 and a transposing component 220. Although FIG. 2 shows example components of FEC device 130, in other implementations, FEC device 130 may contain fewer components, additional components, different components, or differently arranged components than depicted in FIG. 2. Alternatively, or additionally, one or more of the components of FEC device 130 may perform one or more functions described as being performed by another one or more of the components of FEC device 130.

SISO component 210 may include one or more components that receive, process, and/or perform operations on an electrical signal, received from optical receiver 120, in a manner described herein. SISO component 210 may, for example, receive a block (or a frame) of a fixed quantity of samples from optical receiver 120 (e.g., shown as R) and may perform a soft, iterative forward error correction operation on the samples. In one example, SISO component 210 may perform the operation on one or more rows and/or columns of samples within the block of samples and may output a processed block of samples (e.g., shown as R') to transposing component 220. SISO component 210 may also, or alternatively, perform another iteration using the processed block of samples (e.g., corresponding to R') and the original block of samples (e.g., corresponding to R) to generate another processed block of samples (e.g., R') that includes fewer errors than the processed block of samples. SISO component 210 may perform the iterations by alternating between rows and columns and/or based on some other pattern of processing.

SISO component 210 may, for each iteration, dynamically adjust a reliability value, associated with each sample, to cause the quantity of errors to decrease, with each successive iteration, until the operation converges (e.g., when all the errors are corrected). The dynamic adjustment of the reliability value may cause the operation to converge within a period of time that is less than a time period that does not include dynamically adjusting the reliability value. Additionally, or alternatively, the dynamic adjustment of the reliability value may enable SISO component 210 to converge the operation when a gridlock error condition, to be described in greater detail below (e.g., with respect to FIGS. 6A and 6B), is associated with the block of samples.

Transposing component 220 may include one or more components that allow samples associated with a block of samples to be stored, retrieved, and/or transposed. In an example implementation, transposing component 220 may include a memory that stores the block of samples within rows and/or columns associated with a forward error correction frame. Transposing component 220 may write samples to the rows and/or columns and/or may read samples from the rows and/or columns. Transposing component 210 may also, or alternatively, cause a sample, that is stored at a first location within the memory that corresponds to a position within a row, to be read from the first location and written to a second location, within the memory, that corresponds to a position within a column. Additionally, or alternatively, transposing component 210 may also, or alternatively, cause another sample, that is stored at a third location within the memory that corresponds to another position within a column, to be read from the third location and written to a fourth location, within the memory, that corresponds to another position within a row.

Figure 3:
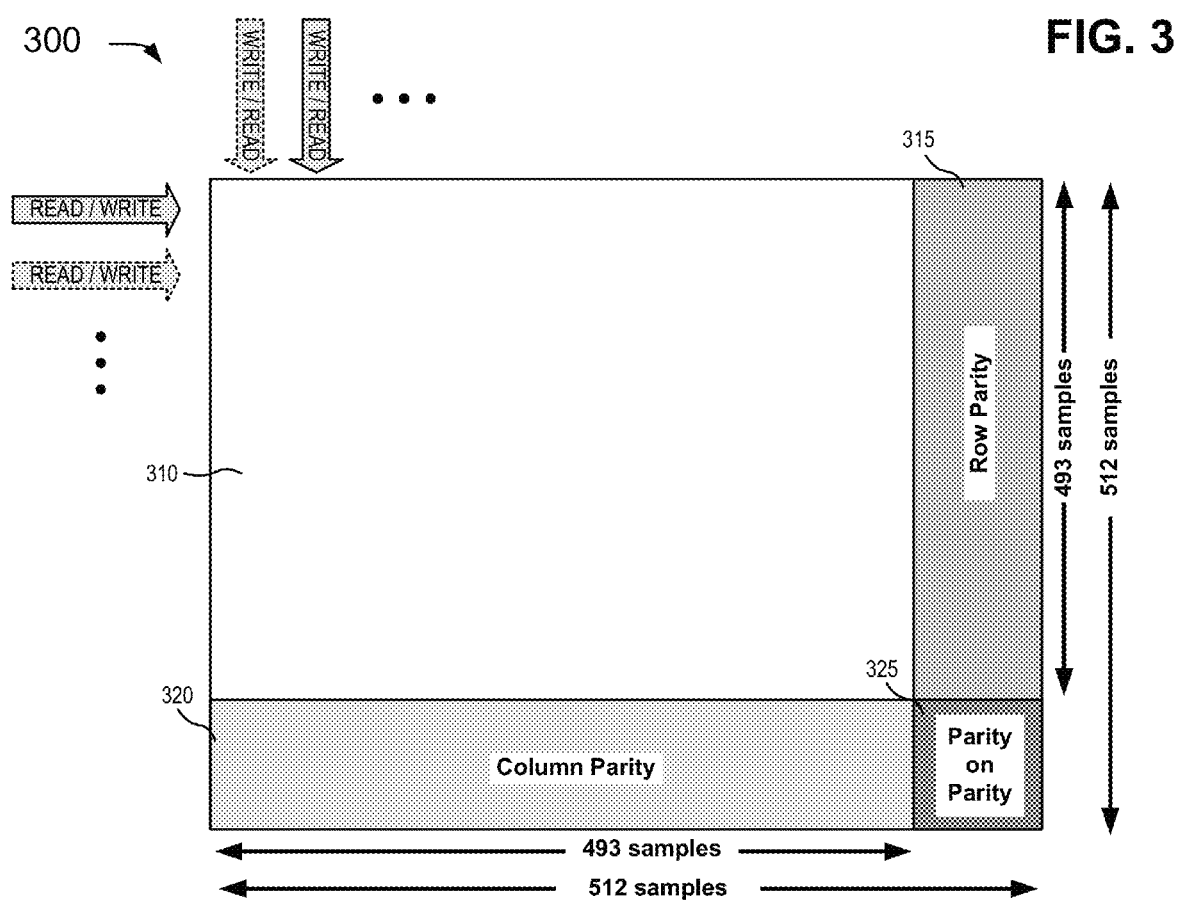
FIG. 3 is a diagram of an example data structure that stores product codes according to an implementation described herein.

FIG. 3 is a diagram of an example data structure 300 that stores product codes according to an implementation described herein. In an example implementation, data structure 300 may be stored in a memory associated with FEC device 130. Additionally, or alternatively, data structure 300 may be stored in a memory associated with optical receiver 120. As shown in FIG. 3, data structure 300 may include a product code field 310, a row parity field 315, a column parity field 320, and/or a parity on parity field 325. The quantity of fields, within data structure 300, are included for explanatory purposes. In another implementation, there may be additional fields, fewer fields, different fields, or differently arranged fields than are shown with respect to data structure 300.

Product code field 310 may store product codes in horizontal rows and/or vertical columns. The product codes may generated, by optical transmitter 110, based on a signal received from client device 105 and iterative forward error correction encoding by optical transmitter 110 (e.g., using a forward error correction code). Optical transmitter 110 may transmit an optical signal, that includes the product codes, to optical receiver 120. Optical receiver 120 may receive the optical signal and may store the product codes in product code field 310. Additionally, or alternatively, optical receiver 120, may associate reliability bits with the product codes in a manner similar to that described above with respect to FIG. 1. Optical receiver 120 may transmit, to FEC device 130, the product codes that include the reliability bits.

In one example, product codes may be written, by FEC device 130, to a row as an encoded word. A different product word may be horizontally written to each row (e.g., as shown by the right-pointing arrows labeled as "read/write"). Alternatively, or additionally, product codes may be vertically written, by FEC device 130, to a column as an encoded word. A different product word may be written to each column (e.g., as shown by the down-pointing arrows labeled as "read/write"). The product words may be read from the rows and processed by FEC device 130, and the processed words may be written to the rows associated with product code field 310. Additionally, or alternatively, product words may be read from the columns and processed by FEC device 130, and the processed words may be written to the columns associated with product code field 310.

Row parity field 315, may store error correction bits that can be used for decoding product codes, stored within the rows of product code field 310, on an iterative basis. The error correction bits, stored within row parity field 315, may be generated by optical transmitter 110 and inserted into an optical signal that is transmitted to optical receiver 120. Optical receiver 120 may receive the optical signal and may store, in row parity field 315, the error correction bits, obtained from the optical signal, to allow errors within the product codes, stored within rows of product code field 310, to be identified and/or corrected by FEC device 130.

Column parity field 320 may store other error correction bits that can be used for decoding product codes, stored within the columns of product code field 310, on an iterative basis. The other error correction bits, stored within column parity field 320, may be generated by optical transmitter 110 and inserted into the optical signal. Optical receiver 120 may receive the optical signal and may store, in column parity field 320, the other error correction bits, obtained from the optical signal, to allow errors within the product codes, stored within columns of product code field 310, to be identified and/or corrected by FEC device 130.

Parity on parity field 325 may store further error correction bits that allow the error correction bits within row parity field 315 and/or the other error correction bits within column parity field 320 to be decoded and/or checked for errors. The further error correction bits, stored within parity and parity field 325, may be generated by optical transmitter 110 and inserted into the optical signal. Optical receiver 120 may receive the optical signal and may store, in parity on parity field 325, the further error correction bits, obtained from the optical signal, to allow errors associated with the error correction bits and/or the other error correction bits to be identified and/or corrected by FEC device 130.

In an example implementation, data structure 300 may be sized to conform to a block of samples and/or a forward error correction frame of samples. In one example, data structure 300 may include 512 rows and 512 columns (e.g., 512×512) and may store product codes in 493 rows (e.g., rows 0 through 492) and error correction bits, associated with column parity field 320, in the remaining rows (e.g., rows 493 through 511). Additionally, or alternatively, data structure 300 may store product codes within 493 columns (e.g., columns 0 through 492) and error correction bits, associated with row parity field 315, in the remaining columns (e.g., columns 493 through 510).

While the description below describes a soft iterative forward error correction operation in the context of a 512×512 data structure, such as data structure 300, for explanatory purposes, other implementations may not be so limited. For example, the soft iterative forward error correction operation could be performed using a data structure with a quantity of rows and/or columns that are different from 512×512.

Figure 4:
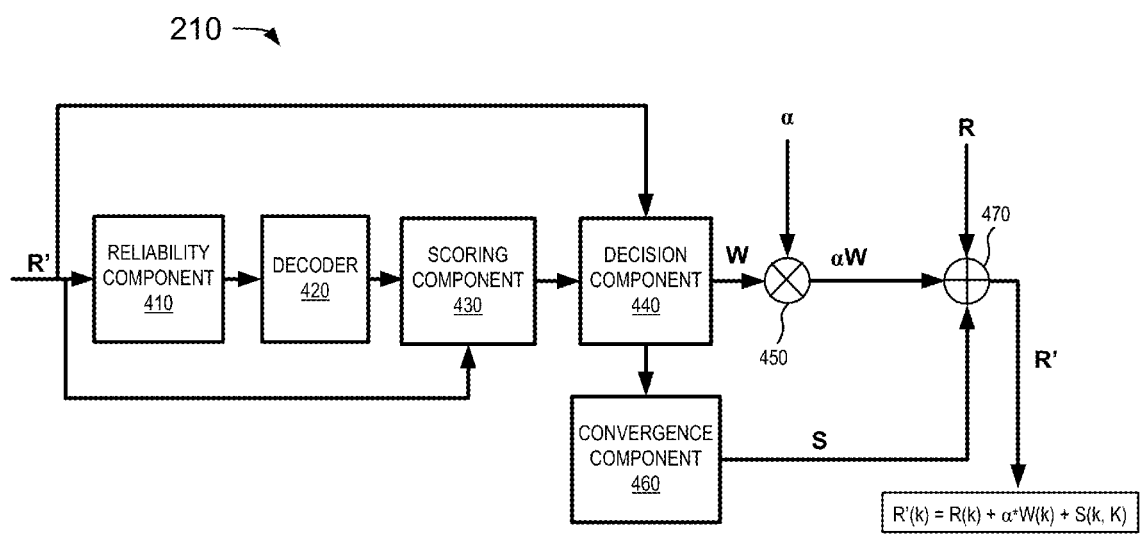
FIG. 4 is a diagram of example components of a soft-in-soft-out (SISO) component of FIG. 2.

FIG. 4 is a diagram of example components of SISO component 210. As illustrated in FIG. 4, SISO component 210 may include a set of components, such as a reliability component 410, a decoder component 420, a scoring component 430, a decision component 440, a multiplier component 450, a convergence component 460, and a summing component 470.

Although FIG. 4 shows example components of SISO component 210, in other implementations, SISO component 210 may contain fewer components, additional components, different components, or differently arranged components than depicted in FIG. 4. Alternatively, or additionally, one or more of the components of SISO component 210 may perform one or more functions described as being performed by another one or more of the components of SISO component 210.

Reliability component 410 may receive and/or process a block of samples to identify a quantity product codes associated with a lowest level of reliability. Reliability component 410 may, for example, process a first row of samples (e.g., read from data structure 300 of FIG. 3) associated with a processed block of samples (e.g., shown as R'). If the block of samples have arrived from receiver 120 and have not yet been processed (e.g., an original block of samples, shown as R), then reliability component 410 may process the first row of samples from the original block of samples. In another example, reliability component 410 may process a first column of samples rather than the first row of samples.

Reliability component 410 may for example, identify reliability values for each product code, within the first row of samples, based on reliability bits included within each of the samples. Reliability component 410 may select product codes with reliability values that are lowest (e.g., 0, +/−1, etc.) (hereinafter referred to as "least reliable product codes (LRPs)" or "least reliable positions (LRPs)") among reliability values with which product codes are associated. In one example, each row may include 512 samples and reliability component 410 may identify six LRPs from among each row. Reliability component 410 may select LRPs from each row within the block of samples and may output the selected LRPs to decoder component 420. Each of the selected LRPs may include information that identifies a respective position (e.g., position k, where $0 \leq k \leq 511$), within each row, with which the selected LRP is associated.

Reliability component 410 may receive a processed block of samples and may process a first column to select a quantity of LRPs associated with the first column in a manner similar to that described above. In one example, each column may include 512 samples and reliability component 410 may identify six LRPs from among each column. Reliability component 410 may output the selected LRPs to decoder component 420. Each of the selected LRPs may include information that identifies a respective position (e.g., position k, where $0 \leq k \leq 511$), within each column, with which the selected LRP is associated.

The description below identifies the quantity of selected LRPs, for each row and/or column, as including the six LRPs for explanatory purposes only. Alternatively, or additionally, the quantity of selected LRPs may include a number that is different than six selected LRPs.

Decoder component 420 may process the first row of samples based on the selected quantity of LRPs received from reliability component 410. For example, decoder component 420 may generate candidate product code words (hereinafter referred to collectively as "code words" and individually as "codeword") associated with the first row based on modified versions of the selected LRPs. In one example, decoder component 420 may invert a bit associated with a first LRP by causing a bit, associated with the first value (e.g., 1) to be changed to the second value (e.g., 0) or by causing the bit, associated with the second value, to be changed to the first value. Decoder component 420 may generate the first candidate codeword based on unmodified product codes within the first row and a first modified product code caused by inverting the bit associated with the first LRP. Decoder component 420 may generate a second candidate codeword based on unmodified product codes within the first row, the first modified product code and a second modified product code. The second modified product code may be created by inverting a bit associated with a second LRP in a manner similar to that described above.

Decoder component 420 may modify the six LRPs in a variety of possible combinations (e.g., $2^6=64$ possible combinations) and may generate different candidate code words (e.g., 64 candidate code words) based on the different possible combinations of modified LRPs. Decoder component 420 may generate different candidate code words for each row and/or column based on the selected LRPs for each row and/or column, respectively.

Additionally, or alternatively, decoder component 420 may decode each of the candidate code words to generate candidate words (e.g., 64 candidate words). Decoder component 420 may perform the decoding using a forward error correction code (e.g., a BCH code or some other error correction) associated with a forward error correction code used to generate the product codes. Decoder 420 may output the candidate words to scoring component 430.

Scoring component 430 may receive candidate words and may process the candidate words to identify a word that is most likely to include a fewer quantity of errors relative to a word used in a previous iteration. For example, scoring component 430 may receive the candidate words, associated with a row or column, from decoder component 420 and may process the candidate words to select a candidate word that is the most likely to include a fewer quantity of errors than a first word, associated with the row or column, from a previous iteration.

Scoring component 430 may identify a respective measure of similarity for each of the candidate words relative to the first word. The measure of similarity may for example, be measured on a bit-by-bit basis. In one example, scoring component 430 may compare a first bit, of one the candidate words (e.g., a second word), to a first bit of a first word, associated with a previous iteration, to determine whether the first bit, of the second word, matches the first bit of the first word (hereinafter referred to as a "matching bit"). Scoring component 430 may compare each bit, of the second word, with a respective bit of the first word to identify a quantity of matching bits within the second word. Scoring component 430 may identify a measure of similarity of the second word, relative to the first word, based on the quantity of matching bits. Thus the measure of similarity of the second word, relative to the first word, may increase as a quantity of matching bits increases or may decrease as the quantity of matching bits decreases.

Additionally, or alternatively, the measure of similarity between one of the candidate words (e.g., a second word) may be based on a distance between the second word and the first word from the previous iteration. The measure of similarity may be based on the bit-by-bit comparison between the first word and the second word, which may, in one example, be represented by a Euclidean distance and/or some other mathematical function. In this example, the Euclidean distance may be identified based on a difference between a first bit associated with the first word and a first bit associated with the second word, a second bit associated with the first word and a second bit associated with the second word, and so on (e.g., $d(p, q) = ((q1-p1)^2 + (q2-p2)^2 + \ldots + (qn-pn)^2)^{1/2}$, where $d(p, q)$ represents the distance between the first word (p) and the second word (q), and where p1, p2, ..., pn ($n \geq 1$) and q1, q2, ..., qn, represent bits associated with the first word and the second word, respectively). Scoring component 430 may identify distances between the candidate words and first word and may output information that identifies the distances to decision component 440.

While the description below describes how the first word and/or candidate words may be processed based on the Euclidian distances, in another example implementation, the first word and/or candidate words may be processed according to a measure of similarity that is different from the Euclidean distance, such as a measure of similarity that is based on a respective sum of a quantity of matching bits between the candidate words and the first word, a sum of the respective square of the distances between respective bits of the candidate words and the first word (e.g., $d'(p, q) = ((q1-p1)^2 + (q2-p2)^2 + \ldots + (qn-pn)^2)$, where $d'(p, q)$ represents the sum of the respective square of the distances between a candidate word and the first word), etc.

Decision component 440 may include one or more components to generate extrinsic information based on measures of similarity between candidate words and a word associated with a previous iteration. For example, decision component 440 may select a candidate word associated with a shortest distance that is less than the distances associated with other candidate words. Based on the selected word (sometimes referred to as "vector D"), decision component 440 may select a competitor word (sometimes referred to "competitor word C") to be used to generate extrinsic information. The extrinsic information may allow decision component 440 to adjust (e.g., increase or decrease) a level of reliability for a word on which the selected word is based.

For each bit, associated with vector D, decision component 440 may search the other 63 candidate words (e.g., that were not selected by decision component 440) to identify competitor word C. For example, if the first bit, of vector D, is associated with a first value (e.g., 1), then decision component 440 may identify one or more other words, of the 63 candidate words, that include a first bit that is not associated with the first value (e.g., a second value, such as 0). Decision component 440 may select, as competitor word C, one of the other words associated with a shortest Euclidean distance relative to Euclidean distances associated with the other words.

Decision component 440 may generate an extrinsic value for a each bit within vector D (e.g., W(k), where W is the extrinsic value and k presents a bit within vector D). The extrinsic value may be determined by multiplying a sign of vector D based on the particular bit (e.g., sign(D(k))), by the a first quantity specified as a difference between the Euclidean distance (ED) of the competitor word C (e.g., ED(C)) and the Euclidean distance of vector D (e.g., ED(D)), minus a particular bit from the first word (e.g., R'(k)) associated with previous iteration (e.g., W(k)≅=sign(D(k))*(ED(C)−ED(D))−R'(k)). The sign of vector D may be set as positive (e.g., +1) when a bit corresponds to the first value (e.g., 1) and may be set as negative (e.g., −1), when a bit corresponds to the second value (e.g., 0).

Thus, for the first bit (e.g., where k=0) that was assumed, in the example above, to correspond to the first value (e.g., 1), the extrinsic value may be based on a quantity defined as the difference in Euclidean distance competitor word C and vector D minus the first bit of the first word (e.g., W(0)≅=(+1)*(ED(C)−ED(D))−R'(0)).

In another example, if a second bit of vector D (e.g., k=1) is associated with a second value (e.g., 0), then decision component 440 may identify one or more other words, of the 63 candidate words, that include a second bit that is not associated with the second value (e.g., a first value, such as 1). Decision component 440 may select, as another competitor word C, one of the other words associated with a shortest Euclidean distance relative to Euclidean distances associated with the other words. Decision component 440 may generate another extrinsic value (e.g., W(1)) associated with the second bit. Thus, for the second bit, the extrinsic value may be based on a quantity defined as the difference in Euclidean distance competitor word C and vector D minus the second bit of the first word (e.g., W(1)≅=(−1)*(ED(C)−ED(D))−R'(1)=>(ED(D)−ED(C)−R'(1)). Decision component 440 may use the extrinsic value to adjust, on a bit-by-bit basis, a level of reliability of the bits associated with vector D. Decision component 440 may output, to multiplier component 450, the extrinsic value for each bit associated with vector D (e.g., bit 1, bit 2, . . . , and bit 512).

Multiplier component 450 may include one or more components to receive and/or combine one or more signals to generate an output signal. Multiplier component 450 may, for example, receive a first signal that includes one or more of the extrinsic values (e.g., W) associated with vector D and a second signal that identifies which error correction iteration (e.g., shown as α) is being performed by FEC device 130. Multiplier component 450 may combine the first signal and the second signal by multiplying the first signal by the second signal and may output a combined signal (e.g., α*W), to summing component 470.

For example, during a first iteration (e.g., where α=0), multiplier component 450 may not output a combined signal and/or may output a first combined signal that corresponds to a value of zero. During a second iteration (e.g., where α=1), multiplier component 450 may also, or alternatively, output a second combined signal (e.g., 1*W) to summing component 470. During a third iteration (e.g., where α=2), multiplier component 450 may also, or alternatively, output a third combined signal (e.g., 2*W) to summing component 470. In other words, multiplier component 450 may cause a contribution of the extrinsic value to increase as the quantity of iterations increases.

Convergence component 460 may include one or more components to modify a level of reliability associated with a word, associated with a previous iteration, based on a quantity of errors associated with the word. Convergence component 460 may, for example, cause a level of reliability, associated with the word associated with the previous iteration, to decrease when a quantity of errors within the word, associated with a previous iteration, is greater than a threshold (e.g., $N_{TH}$). In another example, convergence component 460 may cause the level of reliability, associated with word, to increase when the quantity of errors is greater than the threshold. In yet another example, convergence component 460 may not modify the level of reliability when the quantity of errors, within the word, is approximately equal to the threshold.

Convergence component 460 may determine the quantity of errors, that have been corrected in vector D (e.g., $N_{ERR}$) based on a quantity of bits, within vector D, that are different than bits within the word associated with the previous iteration (e.g., R). Convergence component 460 may generate a signal (e.g., S) that may modify a reliability associated with a word to be outputted by SISO component 210. For example, convergence component 460 may generate the signal based on a difference between the quantity of errors corrected in vector D (e.g., $N_{ERR}$) and the threshold (e.g., $N_{TH}$), a quantity of iterations performed (e.g., K), and/or a sign of vector D (e.g., sign(D(k)), where k is a particular bit within vector D (e.g., where S(k,K)≅sign(D(k))*($N_{TH}$−$N_{ERR}$)*K). The value of K may vary from a first value (e.g., zero or some other first value) during a first iteration and a second value (e.g., one or some other second value) during higher iterations, such as iterations 8, 9, 10, etc.

Thus, if the quantity of errors corrected by vector D is greater than the threshold, the reliability of every bit within the word, associated with the previous iteration, may be decreased by ($N_{TH}$−$N_{ERR}$)*K for bits, within vector D, corresponding to a first value (e.g., 1) or decreased by ($N_{ERR}$−$N_{TH}$)*K for bits, in vector D, corresponding to a second value (e.g., 0). Decreasing the reliability of the word, associated with the previous iteration, may increase a likelihood that bits, within the word and corresponding to the first value, may be inverted to correspond to the second value. Additionally, or alternatively, decreasing the reliability of the word, associated with the previous iteration, may increase a likelihood that other bits, within the word and corresponding to the second value, may be inverted to correspond to the first value. The likelihood that bits, within the word associated with the previous iteration, will be inverted may also, or alternatively, increase as the quantity of iterations increases (e.g., as K increases).

In another example, if the quantity of errors corrected by vector D is less than the threshold, the reliability of every bit within the word, associated with the previous iteration, may be increased by $(N_{TH}-N_{ERR})*K$ for bits, within vector D, corresponding to a first value (e.g., 1) or increased by $(N_{ERR}-N_{TH})*K$ for bits, in vector D, corresponding to a second value (e.g., 0). Increasing the reliability of the word, associated with the previous iteration, may decrease a likelihood that bits, within the word and corresponding to the first value, may be inverted to correspond to the second value. Additionally, or alternatively, increasing the reliability of the word, associated with the previous iteration, may decrease a likelihood that other bits, within the word and corresponding to the second value, may be inverted to correspond to the first value. The likelihood that the bits, within the word associated with the previous iteration, will be inverted may also, or alternatively, decrease as the quantity of iterations increases (e.g., as K increases).

Alternatively, or additionally, if the quantity of errors corrected by vector D is equal to the threshold, then the reliability of every bit within the word, associated with the previous iteration, may not be increased nor decreased. Convergence component 460 may output, to summing component 470, a signal (e.g., S) that modifies the reliability of the word associated with the prior iteration.

Summing component 470 may include one or more components to receive and/or combine one or more signals to generate an output signal. Summing component 470 may, for example, receive a first signal that includes a weighted extrinsic value (e.g., shown as $\alpha W$), a second signal that includes a word associated with a previous iteration (e.g., shown as R), and a third signal (e.g., shown as S) to modify a level of reliability of the word associated with the previous iteration. Summing component 470 may combine the first signal, the second signal, and the third signal by summing the first signal, the second signal, and the third signal and outputting the combined signal (e.g., R', where $R'=R+\alpha W+S$).

For example, during a first iteration (e.g., where $\alpha=0$ and $K=0$), summing component 470 may output, as the combined signal, a word associated with a block of samples received from optical transmitter 120 (e.g., where R'=R). In another example, during a second iteration (e.g., where $\alpha>0$ and $K>0$), summing component 470 may output, as the combined signal, a word associated with a previous iteration (e.g., R), a weighted extrinsic value (e.g., $\alpha W$) that corrects one or more bits associated with the word, and value that modifies a reliability associated with the word (e.g., where $R'=R+\alpha W+S$).

Figure 5:
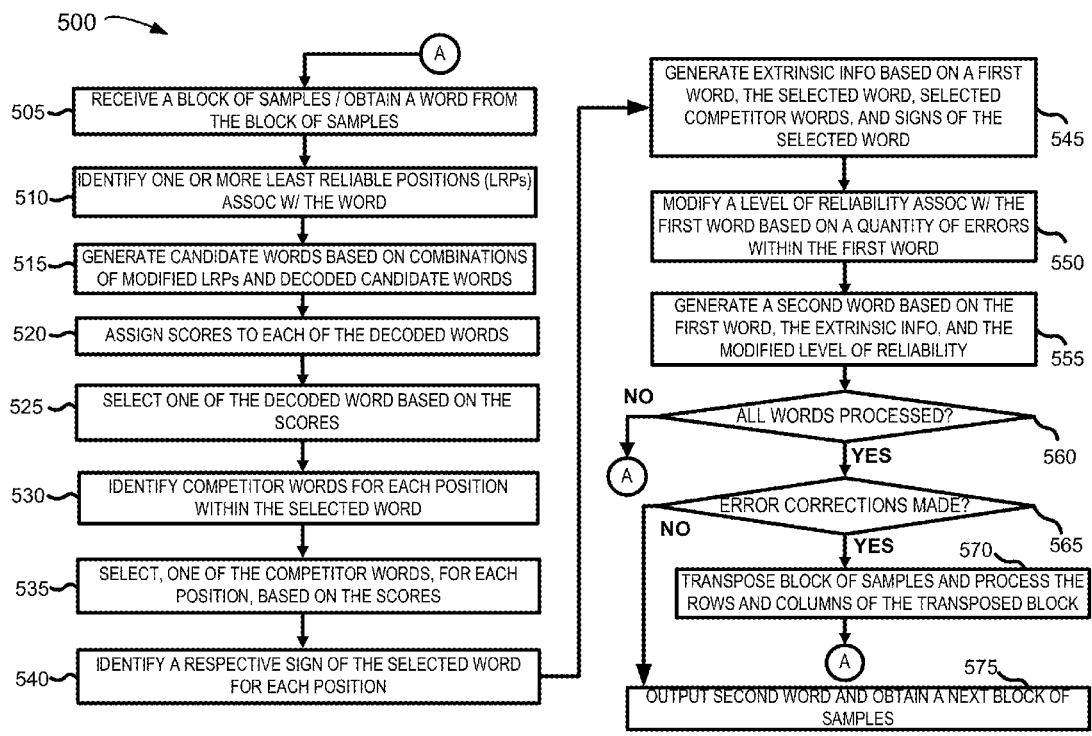
FIG. 5 is a flow chart an example process for decoding block codes by controlling a level of reliability associated with a decoded word.

FIG. 5 is a flow chart an example process 500 for decoding block codes by controlling a level of reliability associated with a decoded word. In an example implementation, process 500 may be performed by FEC device 130. Alternatively, or additionally, some or all of process 500 may be performed by a device or collection of devices separate from, or in combination with, FEC device 130.

As shown in FIG. 5, process 500 may include receiving a block of samples and obtaining a word from the block of samples (block 505), and identifying one or more least reliable positions (LRPs) associated with the word (block 510). For example, FEC device 130 may receive, from optical receiver 120, a block of samples. Each sample may include one or more reliability bits, that identify a level of reliability of the encoded bits, associated with locations in a product code. FEC device 130 may obtain, from the block of samples, a row of samples that represents an encoded word (e.g., that includes one or more product codes). In another example, FEC device 130 may obtain, from a column within the block of samples, an encoded word.

FEC device 130 may, in a manner similar to that described above with respect to FIG. 4, analyze the reliability bits, included in each of the samples, to identify a respective level of reliability associated with each of the product codes. FEC device 130 may identify LRPs, within the encoded word, that correspond to product codes associated with lowest levels of reliability (e.g., 0, +1, −1, etc.) that are less than other levels of reliability (e.g., +2, −2, +3, −3, etc.) associated with other product codes within the encoded word. Each of the LRPs may correspond to a respective position (e.g., k) within the encoded word. In one example, the block of samples may include 512 rows and 512 columns of samples. In another example, the block of samples may include a quantity of rows and/or columns that is different than 512 rows and/or 512 columns, respectively. Additionally, or alternatively, FEC device 130 may identify six LRPs within the encoded word. In another example, FEC device 130 may identify a quantity of LRPs that is different than the six LRPs.

Process 500 may also include generating candidate words based on combinations of modified LRPs and decoding the candidate words (block 515), and assigning scores to each of the decoded candidate words (block 520). For example, FEC device 130 may, in a manner similar to that described above with respect to FIG. 4, generate candidate words based on the encoded word that includes modified versions of the LRPs. For example, FEC device 130 may generate a first candidate word by inverting a bit (e.g., causing the bit to be changed from a first value to a second value or vice versa), within the encoded word, that corresponds to one of the LRPs. FEC device 130 may also, or alternatively, generate a second candidate word by inverting a bit, within the encoded word, that corresponds to another one of the LRPs. There may be a quantity of possible combinations in which bits, corresponding to the LRPs, may be inverted to generate other candidate words, based on two raised to a power that corresponds to the quantity of LRPs (e.g., $2^6=64$ possible combinations for six LRPs). FEC device 130 may generate a candidate word for each of the possible combination (e.g., 64 candidate words when six LRPs are used to generate the candidate words).

FEC device 130 may also, or alternatively, decode each of the candidate words using an error correction code and/or based on error correction information included within the row of samples. The error correction code may, for example, be associated with another error correction code, used by optical transmitter 110, to generate the product codes (e.g., a BCH code and/or some other code).

FEC device 130 may also, or alternatively, assign scores to the decoded words based on a measure of similarity between the decoded words and a word obtained from a same row (or column) during a previous iteration (hereinafter referred to as a "first word"). If the iteration corresponds to a first iteration, then the first word may correspond to the encoded word. FEC device 130 may, in a manner similar to that described above with respect to FIG. 4, determine a measure of similarity, for a decoded word, based on a distance (e.g., a Euclidean distance) between the decoded word and the first word associated with the previous iteration. The distance may be determined on a bit-by-bit basis (or a position-by-position basis). FEC device 130 may identify respective distances for each of the decoded words and may associate the respective distances with each of the decoded words. A decoded word associated with a shortest distance, that is less than any other of the respective distances, may be assigned a highest score; another decoded word, associated with a next-shortest distance, may be assigned a next-highest score; and so on. In another example, FEC device 130 may determine the measures of similarity for the decoded words in a manner that does not include assigning the scores to the decoded words.

Process 500 may further include selecting one of the decoded words based on the scores (block 525); identifying competitor words for each position within the selected word (block 530); and selecting one of the competitor words for each position based on the scores (block 535). For example, FEC device 130 may examine the scores assigned to the decoded words and may select a decoded word (e.g., as vector D) with which a highest score is associated. In another example, FEC device 130 may examine the measures of similarity of the decoded words and may select a decoded word based on the highest measure of similarity with the first word from the previous iteration (e.g., based on a shortest Euclidean distance between the selected word and the first word).

FEC device 130 may also, or alternatively, identify one or more competitor words, for each bit, or position, associated with the selected word. For example, in a manner similar to that described above with respect to FIG. 4, FEC device 130 may determine a value (e.g., 0 or 1, and/or other values) for a first bit within the selected word. FEC device 130 may, based on the determination of the value, search the other decoded words (e.g., the other 63 decoded words that were not selected by FEC device 130) to identify one or more of the other decoded words that includes a first bit with a value that is different than the value of the first bit of the selected word. FEC device 130 may select, as a competitor word (e.g., competitor word C), one of the other decoded words associated with the highest score and/or with a shortest distance to the word associated with the previous iteration. FEC device 130 may also, or alternatively, repeat the process for a next bit within the selected word and may identify another competitor word associated with next bit. FEC device 130 may identify a set of competitor words that correspond to the bits on which the selected word is based.

Process 500 may still further include identifying a respective sign of the selected word for each position (block 540) and generating extrinsic information based on a first word, the selected word, the selected competitor words, and the signs of the selected word (block 545). For example, FEC device 130 may examine each bit within the selected word and may associate a respective positive value or a negative value, to the selected word, for each of the bits. In one example, the positive value and/or the negative value may be associated with the selected word using a mathematical function, such as a sign function. FEC device 130 may, for example and in a manner similar to that described above with respect to FIG. 4, determine whether a first bit, within the selected word, corresponds to a first value (e.g., 1). Based on a determination that the first bit corresponds to the first value, FEC device 130 may assign a positive value (e.g., +1 or some other positive value) to the selected word in a manner that corresponds to the first bit. If, however, FEC device 130 determines that the first bit corresponds to a second value (e.g., 0), then FEC device 130 may assign a negative value (e.g., −1 or some other negative value) to the selected word in a manner that corresponds to the first bit. FEC device 130 may assign other positive values and/or negative values, to the selected word, in a manner that corresponds to the other bits within the selected word.

FEC device 130 may also, or alternatively, generate extrinsic information to be used to process the selected word. For example, FEC device 130 may, in a manner similar to that described above with respect to FIG. 4, generate the extrinsic information, on a bit-by-bit basis, based on the selected word, the selected competitor words, the first word associated with the previous iteration, and/or signs associated with the selected word. FEC device 130 may generate a distinct extrinsic value (e.g., W) for each bit within the selected word. The extrinsic values may collectively represent an extrinsic vector (e.g., W(k), where k represents the bits within the selected word) associated with the selected word.

FEC device 130 may, for example, generate a first extrinsic value associated with a first bit within the selected word. The first extrinsic value may be generated based on a sign associated with the selected word for the first bit; a first distance between the selected word and the first word associated with the previous iteration; a second distance between a competitor word associated with the first bit and the first word; and/or a value of a first bit within the first word. Thus, FEC device 130 may generate the first extrinsic value by subtracting the value of the first bit of the first word, from a product obtained as a result of multiplying the sign, associated with the selected word, by a difference between the second distance and the first distance.

Process 500 may also include modifying a level of reliability, associated with the first word, based on a quantity of errors within the first word (block 550). For example, FEC device 130 may, in a manner similar to that described above with respect to FIG. 4, determine whether to modify a level of reliability associated with the first word, associated with the previous iteration, based on a quantity of errors, associated with the first word relative to a threshold. FEC device 130 may generate a modification value (e.g., S) that causes the level of reliability, of the first word, to increase, decrease, or remain unchanged. Generating the modification value will be described in greater detail below with respect to FIGS. 6A, 6B, and 7.

Process 500 may further include generating a second word based on the first word, the extrinsic information, a modified level of reliability associated with the first word (block 555). For example, FEC device 130 may, in a manner similar to that described above with respect to FIG. 4, generate a second word (e.g., R') that is based on the first word (e.g., R), the extrinsic information (e.g., W), a quantity of iterations performed (e.g., $\alpha$), and/or the modification value (e.g., S). For example, FEC device 130 may generate a first bit, of the second word, based on a first bit of the first word (e.g., R(k), where k=0) that is modified by a weighted version of extrinsic information associated with the first bit (e.g., $\alpha$*W(k), where k=0) and/or the modification value associated with the first word (e.g., S). The weighted extrinsic information may increase as the quantity of iterations increase. FEC device 130 may generate other bits associated with the second word based on other bits associated with the first word (e.g., R(k), where k=1, 2, 3, etc.), the weighted extrinsic information associated with the other bits (e.g., (e.g., $\alpha$*W(k), where k=1, 2, 3, etc.) and/or the modification value associated with the first word (e.g., S).

If all the words are not processed (block 560—NO), then process 500 may include obtaining another word from the block of samples (block 505). For example, FEC device 130 may determine that other words are stored within rows and/or columns associated with the block of samples and may obtain, from the block of samples, another word. FEC device 130 may, in a manner similar to that described above with respect to blocks 510 through 560, process the other word so that a respective second word (e.g., R'(k)), for each word obtained from the rows and/or columns, can be generated by FEC device 130.

If all the words are processed (block 560—YES) and error corrections have been made (block 565—YES), then process 500 may include transposing the block of samples (block 570) and obtaining a word from the transposed block of samples (block 505). For example, FEC device 130 may determine that all of the words within the rows and/or columns, of the block of samples, have been processed and/or that respective second words, for each of the rows and/or columns, have been generated.

Based on the determination that all of the words have been processed and/or that the respective second words have been generated, FEC device 130 may determine whether any error corrections were made to any of the words. FEC device 130 may, for example, determine whether any bits, within the second word, do not match respective bits within the first word associated with a previous iteration. Based on a determination that a bit, associated with the second word, does not match a corresponding bit within the first word (e.g., based on an difference in amplitude, a difference in sign, etc.), FEC device 130 may determine that another processing iteration is to be initiated. Additionally, or alternatively, FEC device 130 may determine that the other processing iteration is to be initiated if any bits, within any of the second words, do not match corresponding bits within the first words.

Additionally, or alternatively, FEC device 130 may determine that a quantity of processing iterations performed on the words is less than an iteration threshold. Based on the determination that the quantity of processing iterations is less than the iteration threshold, FEC device 130 may determine that another processing iteration is to be performed.

Additionally, or alternatively, FEC device 130 may determine that no error corrections were made to any of the words and the quantity of processing iterations performed on the words are less than the iteration threshold. Based on the determination that the quantity of processing iterations is less than the iteration threshold, FEC device 130 may determine that another processing iteration is to be performed regardless of the determination that no error corrections were made to any of the words.

Performing the other processing iteration may allow measures of reliability, of bits within the words, to be adjusted and/or extrinsic information, associated with the bits, to be updated. The adjusted measures of reliability and/or updated extrinsic information may permit errors, within the words and that have thus far gone undetected, to be detected and/or corrected in a manner similar to that described above with respect to blocks 505 through 555.

Based on the determination that another processing iteration is to be performed, FEC device 130 may transpose the block of samples in a manner similar to that described above in FIG. 2. FEC device 130 may transpose the rows and/or columns in a manner that reverses an order that optical transmitter 110 transposed the block of samples when generating the encoded words.

In another example implementation, a transposing operation may be performed on a portion of the bits within the block of samples. For example, the transposing operation could be confined to selected bits associated with LRPs within each word associated with rows and/or columns of the block of samples. Transposing the portion of the bits may reduce processing time, resources and/or expense associated with processing the words with the block of samples.

Based on the transposition of the rows and/or columns, FEC device 130 may initiate a new processing iteration. FEC device 130 may, for example, obtain a word from a row or column of the transposed block of samples and may process the word (e.g., a second word from a previous iteration) in a manner similar to that described above with respect to blocks 510 through 565. Processing the word may include generating a third word that includes fewer errors than a second word on which the third word is based.

If no error corrections are made (block 565—NO), the process 500 may include outputting the second word and obtaining a next block of samples (block 575). For example, FEC device 130 may, for example, determine that all bits within the second word match corresponding bits within the first word associated with a previous iteration. Based on the determination that the bits within the second word match the bits within the first word, FEC device 130 may cease processing the block of samples. Additionally, or alternatively, based on the determination that all of the bits within the second words match all of the corresponding bits within the first words, FEC device 130 may cease processing the block of samples.

Additionally, or alternatively, FEC device 130 may determine that a quantity of processing iterations, performed on the block of samples, is greater than the iteration threshold. Based on the determination that no errors were corrected within the block of samples and that the quantity of processing iterations is greater than the iteration threshold, FEC device 130 may cease processing the block of samples. Additionally, or alternatively, FEC device 130 may determine that a quantity of consecutive processing iterations, where the error corrections were not made, is greater than a consecutive processing threshold. Based on the determination that the quantity of consecutive processing iterations, where the error corrections were not made, is greater than the consecutive processing threshold, FEC device 130 may cease processing the block of samples.

FEC device 130 may output the one or more words, associated with the block of samples, to a client device (e.g., client device 105-2). The outputted words may not include the parity bits added by transmitter 110. FEC device 130 may also, or alternatively, obtain another block of samples from optical transmitter 120 and may process the other block of samples in a manner similar to that described above with respect to blocks 505 through 575.

The description above describes all bits, within each word obtained from the rows and/or columns within the block of samples, as being processed for explanatory purposes. In another implementation, processing may not occur on all bits within each of the words. In one example, FEC device 130 may not fully process particular bits, within a second word (e.g., R') (e.g., generate extrinsic information, compare signs, transpose, etc.), that do not correspond to bits, within a first word (e.g., R) from which the second word is derived, that are among LRPs associated with the first word. Additionally, or alternatively, FEC device 130 may not fully process other bits, within the second word, that do not correspond to bits, within the first word, with a measure of reliability that is greater than a threshold.

Thus, processing of R' may be confined to a portion of the bits, associated with the second word, that correspond to bit positions of the LRPs and/or some other subset of the bits associated with the first word. Processing the portion of the bits may reduce processing time and/or processing resources compared with the processing time and/or resources associated with processing all of the bits within each word.

Figure 6A:
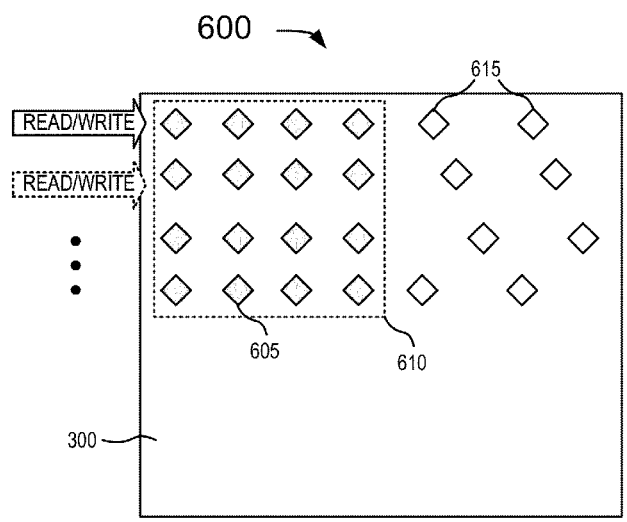
FIGS. 6A and 6B are diagrams of example error patterns that identify an error condition within a data structure.
Figure 6B:
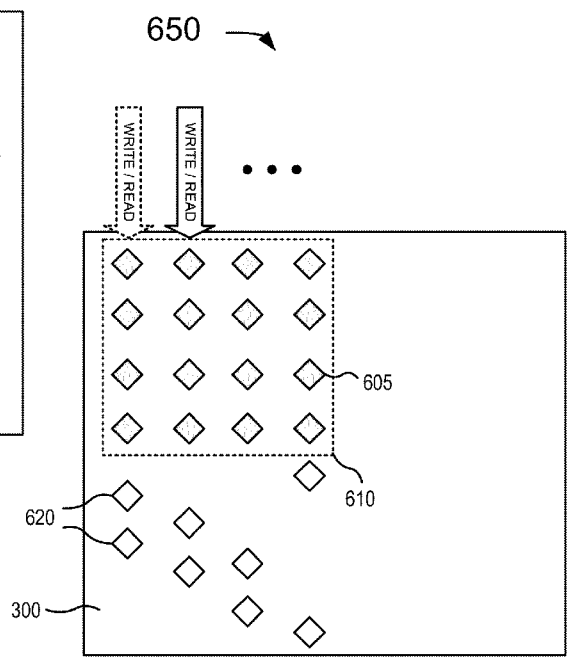

FIGS. 6A and 6B are diagrams of example error patterns 600 and 650, respectively, that identify an error condition within a data structure. In an example implementation, error patterns 600 and/or 650, of FIGS. 6A and/or 6B respectively, may represent a pattern of errors within one or more words that are stored within a data structure (e.g., data structure 300 of FIG. 3). As shown in FIG. 6A, error pattern 600 may identify a collection of errors 605, an error condition pattern 610, and/or a collection of induced row errors 615.

Error 605 may represent a bit error within a word that is stored within a row or column of a data structure (e.g., data structure 300 of FIG. 3). Error condition pattern 610 may represent a quantity of errors (e.g., within dotted square 610) that are greater than an error threshold (e.g., $N_{TH}$). The error threshold may correspond to a quantity of errors, associated with a word that is stored within a row or column of the data structure. Error condition pattern 610 may also, or alternatively, represent an error condition (e.g., a grid lock error condition) within the data structure. Error condition pattern 610 may represent a quantity of errors 605, within one or more of the horizontal rows, that are greater than the error threshold and another quantity of errors 605 within one or more of the vertical columns that are greater than the error threshold. Assume, in the discussion below, that the error threshold corresponds to three bit errors per row and three bit errors per column (e.g., $N_{TH}=3$).

Errors 605, within error condition pattern 610, are shown as being contiguous for explanatory purposes. In another implementation, error condition patter 610 may indicate that an error condition exists when quantities of errors 605, that are not contiguous within one or more rows and/or columns, are greater than the error threshold within the one or more rows and/or columns. For example, error condition pattern 610 may include a row and/or a column that includes no errors 605, fewer errors 605, differently arranged errors 605, and/or a greater quantity of errors 605 than are included within the rows or columns associated with error condition patter 610.

Induced row error 615 may represent an error, within a row, that is caused by a conventional FEC device when performing soft iterative forward error correction on the row. Induced row error 615 may be created, by the conventional FEC device, when a quantity of errors 605 (e.g., $N_{ERR}=4$), within the row, is greater than the error threshold (e.g., $N_{TH}=3$). Additionally, or alternatively, the conventional FEC device, may not correct errors 605, within the row, when the quantity of errors 605 is greater than the threshold. In other words, the quantity of errors within the row may actually increase as a result of the row-based error correction, when the quantity of errors, within the row, is greater than the error threshold.

As shown in FIG. 6B, error pattern 650 may identify the collection of errors 605, error pattern 610, and a collection of induced column errors 620. Induced column error 620 may represent an error, within a column, that is caused by the conventional FEC device when performing soft iterative forward error correction on the column. Induced column error 620 may be created, by the conventional FEC device, when a quantity of errors 605 (e.g., $N_{ERR}=4$), within the column, is greater than the error threshold (e.g., $N_{TH}=3$). Additionally, or alternatively, the conventional FEC device, may not correct errors 605, within the column, when the quantity of errors 605 is greater than the threshold. In other words, the quantity of errors within the column may actually increase as a result of performing the column-based error correction, when the quantity of errors, within the row, is greater than the error threshold.

The conventional FEC device may alternate between row-based error correction and column-based error correction. Thus, the conventional FEC device may perform the row-based error correction to correct the errors shown in FIG. 6B, which may again result in the errors as shown in FIG. 6A. The cycle may repeat indefinitely, which may preclude the quantity of errors from decreasing with successive iterations and/or may cause the conventional FEC device to fail.

FEC device 130, however, can handle the data structures shown in FIGS. 6A and 6B by reducing the quantity of errors, within the data structures shown in 6A and 6B, that allows the soft iterative forward error correction operation to converge. FEC device 130 may, thus, correct all the errors within the data structures shown in FIGS. 6A and 6B without being caused to fail and while avoiding a service disruption.

Figure 7:
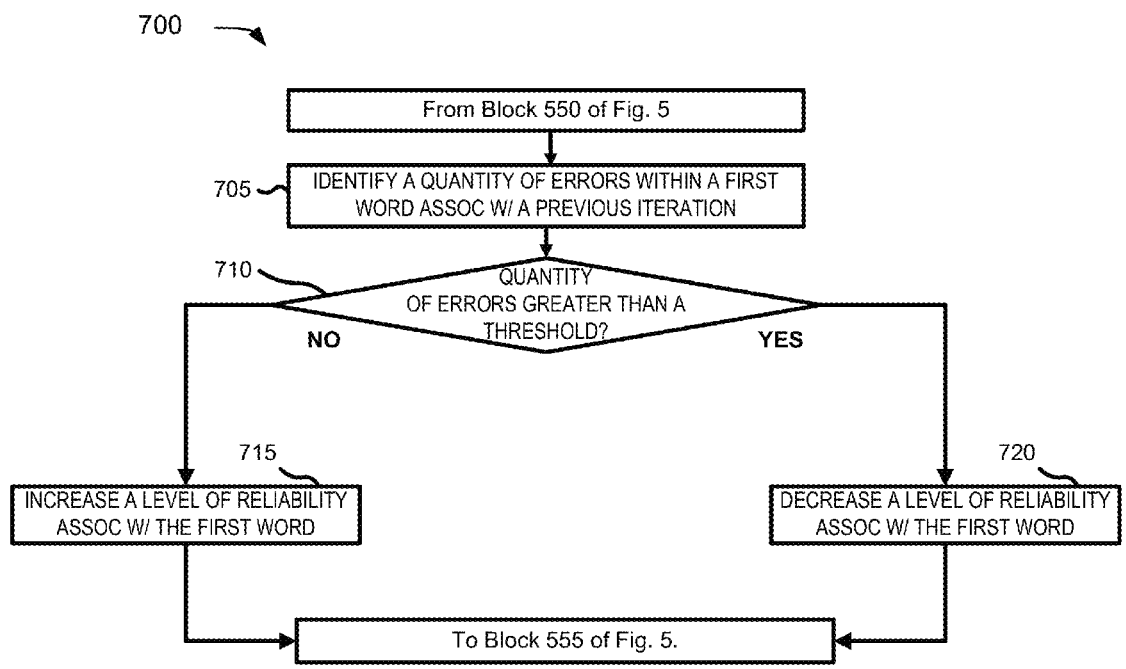
FIG. 7 is a flow chart an example process for modifying a level of reliability of a decoded word.

FIG. 7 is a flow chart an example process 700 for modifying a level of reliability of a decoded word. Process 700 may correspond to block 550 of FIG. 5. In an example implementation, process 700 may be performed by FEC device 130. Alternatively, or additionally, some or all of process 700 may be performed by a device or collection of devices separate from, or in combination with, FEC device 130.

Assume, in the discussion below, that FEC device 130 has selected a word based on a shortest distance between the selected word and a first word, associated with a previous iteration, in a manner similar to that described above with respect to blocks 505-525 of FIG. 5. Assume further than FEC device 130 has identified competitor words for each bit associated with the selected word in a manner similar to that described above with respect to blocks 530 and 535 of FIG. 5. Assume still further that FEC device 130 has generated extrinsic information, based on the selected word, the competitor words, and/or the first word, in a manner similar to that described above with respect to blocks 540 and 545 of FIG. 5.

As shown in FIG. 7, process 700 may include identifying a quantity of errors within a first word associated with a previous iteration (block 705). For example, FEC device 130 may, in a manner similar to that described above with respect to FIG. 4, identify a quantity of errors associated with the first word. FEC device 130 may, for example, compare a first bit, associated with selected word, with a first bit of the first word. FEC device 130 may identify an error, associated with the first word, based on a determination that the first bit, associated with the selected word, does not match the first bit of the first word. FEC device 130 may identify the quantity of errors, associated with the first word (e.g., $N_{ERR}$), based on a quantity of bits, associated with the selected word, that do not match corresponding bits within the first word.

If the quantity of errors is not greater than an error threshold (block 710—NO), then process 700 may include increasing a level of reliability associated with the first word (block 715). For example, FEC device 130 may compare the quantity of errors, within the first word (e.g., $N_{ERR}$), to an error threshold (e.g., $N_{TH}$) that is predetermined by FEC device 130 and/or a network administrator associated with network 100.

Based on a determination that the quantity of errors is not greater than the error threshold (e.g., $N_{ERR} \leq N_{TH}$), FEC device 130 may cause a level of reliability, associated with the first word to increase. For example, FEC device 130 may generate a modification value (e.g., S) to be used to increase the level of reliability of all bits within the first word (e.g., R'(k)). FEC device 130 may, for example, generate the modification value based on a difference between the quantity of errors and the error threshold, an iteration value (e.g., K) associated with a quantity of iterations performed by FEC device 130, and/or a sign of the selected word (e.g., sign(D (k)), where k represents a bit within the selected word). The value of K may increase as the quantity of iterations increase (e.g., $0 \leq K \leq$ quantity of iteration).

FEC device 130 may generate the modification value by multiplying a difference between the error threshold and the quantity of errors (e.g., $N_{TH}-N_{ERR}$) by a product obtained as a result of multiplying the iteration value by the sign of the selected word (e.g., where $S(k,K) \cong sign(D(k))*(N_{TH}-$ $N_{ERR})*K$). Thus, FEC device 130 may increase a level of reliability of first bits within the first word, that correspond to a first value (e.g., 1), by increasing an amplitude (e.g., a power level) of the first bits by a first quantity (e.g., $(N_{TH}-N_{ERR})*K$). In this example, the sign of the selected word, for the first bits, may generally be positive (e.g., $sign(D(k)>0$). The first quantity may increase (e.g., in a positive direction) as the quantity of iterations increase.

Additionally, or alternatively, FEC device 130 may increase a level of reliability of second bits within the first word, that correspond to a second value (e.g., 0), by decreasing an amplitude of the second bits by a second quantity (e.g., $(N_{ERR}-N_{TH})*K$). In this example, the sign of the selected word, for the second bits, may generally be negative (e.g., $sign(D(k)<0$). The second quantity may increase (e.g., in a negative direction) as the quantity of iterations increase.

Thus, the first bits may be increased in reliability by causing the amplitude of the first bits to increase toward to a first amplitude threshold that corresponds to the first value. The second bits may also, or alternatively, be increased in reliability by causing the amplitude of the second bits to decrease toward a second amplitude threshold that corresponds to the second value. Increasing the reliability of the bits, associated with the first word, may decrease a likelihood of FEC device 130 inverting the bits associated with the first word.

In another example, FEC device 130 may not modify the level of reliability of the bits, associated with the first word, when the quantity of errors is approximately equal to the error threshold (e.g., $N_{ERR} \cong N_{TH}$) and/or during a first iteration (e.g., when K=0). In these examples, FEC device 130 may not generate a modification value or may generate a modification value that corresponds to zero (e.g., $S(k,K)=0$, when K=0 and/or when $N_{ERR} \cong N_{TH}$). By neither increasing nor decreasing the level of reliability of the bits, within the first word, a likelihood, of FEC device 130 inverting the bits within the first word, may not change.

If the quantity of errors is greater than the error threshold (block 710—YES), then process 700 may include decreasing a level of reliability associated with the first word (block 720). For example, FEC device 130 may determine that the quantity of errors in the first word, associated with a previous iteration, is greater than the error threshold (e.g., $N_{ERR}>N_{TH}$). Based on the determination that the quantity of errors is greater than the error threshold, FEC device 130 may cause a level of reliability, associated with the first word to decrease. For example, FEC device 130 may generate a modification value (e.g., S) to be used to decrease the level of reliability of all bits within the first word (e.g., R'(k)).

FEC device 130 may generate the modification value in a manner similar to that described above (e.g., where $S(k,K) \cong sign(D(k))*(N_{TH}-N_{ERR})*K$). Thus, FEC device 130 may decrease a level of reliability of first bits within the first word, that correspond to a first value (e.g., 1), by decreasing an amplitude of the first bits by a third quantity (e.g., $(N_{TH}-N_{ERR})*K$). In this example, the sign of the selected word, for the first bits, may generally be positive (e.g., $sign(D(k)>0$). The third quantity may increase (e.g., in a negative direction) as the quantity of iterations increase, which may cause FEC device 130 to invert the first bits, from the first value to the second value, when a level of reliability decreases to a level that is less than a threshold.

Additionally, or alternatively, FEC device 130 may decrease a level of reliability of second bits within the first word, that correspond to a second value (e.g., 0), by increasing an amplitude of the second bits by a fourth quantity (e.g., $(N_{ERR}-N_{TH})*K$). In this example, the sign of the selected word, for the second bits, may generally be negative (e.g., $sign(D(k)<0$). The fourth quantity may increase (e.g., in a positive direction) as the quantity of iterations increase, which may cause FEC device 130 to invert the second bits, from the second value to the first value, when a level of reliability decreases to a level that is less than the threshold.

Thus, the first bits may be decreased in reliability by causing the amplitude of the first bits to decrease toward a second amplitude threshold that corresponds to the second value and the second bits may be decreased in reliability by causing the amplitude of the second bits to increase toward a first amplitude threshold that corresponds to the first value.

While the description above, with respect to FIGS. 5 and 7, describe one word, from a row or column, being processed during a given period of time, another implementation need not be so limited. For example, FEC device 130 may process more than one word during the given period of time. Additionally, or alternatively, FEC device 130 may process, during the given period of time and in a pipeline manner, one or more words within a first block of samples while processing one or more words within a second blocks of samples. Processing the words and/or blocks in the pipeline manner may allow FEC device 130 to continuously perform more than one step, of process 500 of FIG. 7 and/or process 700 of FIG. 7, at any instance, during the period of time, on the words and/or the blocks. For example, FEC device 130 may process words associated with the first block according to one or more steps of process 500 and/or process 700 and may, at a same time, process words associated with the second block according to one or more of the same, or different, steps of process 500 and/or 700.

A system and/or method, described herein, may allow a FEC device to perform an error correction operation, on traffic received from an optical receiver, using an iterative soft decoding technique that allows errors, within the traffic, to be corrected. The FEC device may perform the iterative soft decoding technique in a manner that includes dynamically controlling a level of reliability of bits, associated with the traffic, to correct error and/or to remedy an error condition without causing the FEC device to fail. Correcting errors and/or remedying the error condition, without causing the FEC device to fail, may allow a service disruption to be avoided and/or a quality of service to be received, by a client device, which is greater than a threshold.

The foregoing description provides illustration and description, but is not intended to be exhaustive or to limit the implementations to the precise form disclosed. Modifications and variations are possible in light of the above disclosure or may be acquired from practice of the implementations.

For example, while series of blocks have been described with regard to FIGS. 5 and 7, the order of the blocks may be changed in other implementations. Also, non-dependent blocks may be performed in parallel.

Furthermore, while the disclosed embodiments have been presented as generally suitable for use in an optical network, the systems and methods disclosed herein are suitable for any fiber optic network, fiber network, fiber line, or link that includes one or more transmission spans, amplifier spans, or hops.

Even though particular combinations of features are recited in the claims and/or disclosed in the specification, these combinations are not intended to limit the disclosure of the implementations. In fact, many of these features may be combined in ways not specifically recited in the claims and/or disclosed in the specification. Although each dependent claim listed below may directly depend on only one other claim, the disclosure of the implementations includes each dependent claim 1n combination with every other claim 1n the claim set.

It will be apparent that embodiments, as described herein, may be implemented in many different forms of software, firmware, and hardware in the embodiments illustrated in the figures. The actual software code or specialized control hardware used to implement embodiments described herein is not limiting of the embodiments. Thus, the operation and behavior of the embodiments were described without reference to the specific software code—it being understood that software and control hardware may be designed to implement the embodiments based on the description herein.

No element, act, or instruction used in the present application should be construed as critical or essential to the implementation unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A system comprising:
    a storage device to store a block of words that are generated as a result of a first iteration of an error correction operation, where each word of the block of words includes respective encoded bits and respective sets of reliability bits for identifying a respective level of reliability of each one of the respective encoded bits; and
    one or more devices to:
        receive a first word, of the block of words, for initiating a second iteration of the error correction operation,
        identify different combinations in which a portion of encoded bits, included in the first word, can be inverted to create different combinations of inverted encoded bits
        generate candidate words based on the different combinations of inverted encoded bits,
        decode the candidate words to create decoded words,
        compare the decoded words to the first word to determine distances between the decoded words and the first word,
        select, as a second word, one of the decoded words associated with a shortest one of the distances,
        compare the second word to the first word to identify a quantity of errors associated with the first word,
        generate a first modification value to cause a reliability of the first word to increase to a first reliability level when the quantity of errors is less than an error threshold,
        generate a second modification value to cause the reliability of the first word to decrease to a second reliability level when the quantity of errors is not less than the error threshold,
        output a third word based on the first word and on the first modification value or the second modification value.

2. The system of claim 1, where the one or more devices are further to:
    identify, within the first word, one or more encoded bits associated with a third level of reliability that is less than a fourth level of reliability associated with other encoded bits within the first word,
    identify a plurality of different combinations, of the one or more encoded bits, to be modified, where each of the different combinations uniquely identifies a first portion, of the one or more encoded bits, that are inverted and a second portion, of the one or more encoded bits, that are not inverted, and
    generate the candidate words based on the identified different plurality of combinations of the one or more encoded bits.

3. The system of claim 1, where, when comparing the second word to the first word, the one or more devices are further to:
    compare a first bit, within the second word, to a first bit within the first word, and
    identify a first error when the first bit, within the second word, does not match the first bit within the first word.

4. The system of claim 1, where, when identifying the quantity of errors, the one or more devices are further to:
    compare each bit, within the second word, to a respective different bit within the first word to identify one or more bits, within the second word, that do not match one or more bits within the first word,
    identify the quantity of errors based on the one or more bits, within the second word, that do not match the one or more bits within the first word,
    determine whether the quantity of errors is greater than error threshold, and
    generate the first modification value or the second modification value based on whether the quantity of errors is greater than error threshold.

5. The system of claim 1, where, when generating the first modification value, the one or more devices are further to:
    identify a quantity of iterations of the error correction operation, that have been performed,
    generate the first modification value based on the identified quantity of iterations and based on a difference between error threshold and the quantity of errors, and
    output the third word based on the first word and the first modification value.

6. The system of claim 5, where the one or more devices are further to:
    identify whether a first bit, of the second word, corresponds to a first value or a second value, the second value being different than the first value,
    generate a first bit, associated with the third word, by increasing an amplitude of a first bit, of the first word, by the first modification value, when the first bit, of the second word, corresponds to the first value, and
    generate the first bit, associated with the third word, by decreasing the amplitude of the first bit, of the first word, by the first modification value, when the first bit, of the second word, corresponds to the second value.

7. The system of claim 5, where the first modification value increases as the quantity of iterations increase, and
    where the first modification value is zero during the first iteration.

8. The system of claim 1, where, when generating the second modification value, the one or more devices are further to:
    identify a quantity of iterations of the error correction operation, that have been performed,
    generate the second modification value based on the identified quantity of iterations and based on a difference between the threshold and the quantity of errors, and
    output the third word based on the first word and the second modification value.

9. The system of claim 8, where the level of reliability of the first word decreases as the quantity of iterations increase, and
    where a likelihood that a first bit, within the first word and that corresponds to a first value, is inverted to a second value, different than the first value, increases as the quantity of iterations increase, and where a likelihood that a second bit, within the first word and that corresponds to the second value, is inverted to the first value increases as the quantity of iterations increase.

10. The system of claim 8, where the one or more devices are further to:
identify whether a first bit, of the second word, corresponds to a first value or a second value, the second value being different than the first value,
generate a first bit, associated with the third word, by decreasing an amplitude of a first bit, of the first word, by the second modification value, when the first bit, of the second word, corresponds to the first value, and
generate the first bit, associated with the third word, by increasing the amplitude of the first bit, of the first word, by the second modification value, when the first bit, of the second word, corresponds to the second value.

11. The system of claim 10, where the one or more devices are further to:
determine whether that the amplitude of the first bit, of the first word, decreases to a level that is less than a first amplitude threshold associated with the first value, and
invert the first bit, of the first word, from the first value to the second value when the amplitude of the first bit, of the first word, decreases to a level that is less than the first amplitude threshold.

12. The system of claim 10, where the one or more devices are further to:
determine whether the amplitude of the first bit, of the first word, increases to a level that is greater than a second amplitude threshold associated with the second value, and
invert the first bit, of the first word, from the second value to the first value when the amplitude of the first bit, of the first word, increases to a level that is greater than the second amplitude threshold.

13. A method comprising:
receiving, from an optical receiver and by a device, a plurality of words, each of the plurality of words including a plurality of samples, where each of the plurality of samples includes:
a corresponding one of a plurality of encoded bits, and
respective reliability bits for identifying a respective one of a plurality of levels of reliability of the corresponding one of the plurality of encoded bits;
identifying, by the device and within a first word of the plurality of words, a set of least reliable encoded bits having selected ones of the plurality of levels of reliability that are less than a reliability threshold, where the first word includes different versions with different combinations of inverted bits within the set of least reliable encoded bits;
generating, by the device, a set of candidate words based on the different versions of the first word;
decoding, by the device, the set of candidate words to create a set of decoded words;
comparing, by the device, the set of decoded words to the first word to identify measures of similarity between the set of decoded words and the first word;
selecting, by the device and as a second word, one of the set of decoded words that includes a greatest measure of similarity among the identified measures of similarity;
identifying, by the device, a quantity of errors, associated with the first word, based on the comparison of the second word to the first word;
determining, by the device, whether the quantity of errors is greater than an error threshold;
outputting, by the device, a third word based on a first version of the first word that has a first level of error reliability that is greater than a second level of error reliability associated with the first word when the quantity of errors is not greater than the error threshold; or
outputting, by the device, a fourth word based on a second version of the first word that a third level of error reliability that is less than the first word when the quantity of errors is greater than the error threshold.

14. The method of claim 13, where identifying the quantity of errors includes:
comparing a first bit, within the second word to a first bit within the first word; and
identifying a first error when the first bit, within the second word does not match the first bit within the first word.

15. The method of claim 13, where identifying the quantity of errors includes:
comparing each bit, within the second word, to a respective different bit within the first word to identify one or more bits, within the second word, that do not match one or more bits within the first word; and
identifying the quantity of errors based on the one or more bits, within the second word, that do not match the one or more bits within the first word.

16. The method of claim 13, further comprising:
generating a modification value to be used to increase a reliability of the first word to have a first level when the quantity of errors is less than the error threshold; and
modifying the first word based on the modification value to create the first version of the first word.

17. The method of claim 16, where modifying the first word, based on the modification value, further includes:
identifying a first set of bits, within the first word, that correspond to a first value;
increasing, by the modification value, a respective amplitude of each bit, within the first set of bits, to create a first set of modified bits, where increasing the respective amplitudes causes the first set of modified bits to increase a reliability of the first set of modified bits to have a second level that is greater than a third level of reliability of the first set of bits;
identifying a second set of bits, within the first word, that correspond to a second value, the second value being different than the first value;
decreasing, by the modification value, a respective amplitude of each bit, within the second set of bits, to create a second set of modified bits, where decreasing the respective amplitudes causes the second set of modified bits to have a fourth level of reliability that is greater than a fifth level of reliability of the second set of bits; and
generating the first version of the first word based on the first set of modified bits and the second set of modified bits.

18. The method of claim 13, further comprising:
generating a modification value to be used to decrease the reliability associated with the first word to a sixth level when the quantity of errors is greater than the error threshold; and
modifying the first word based on the modification value to create the second version of the first word.

19. The method of claim 18, where modifying the first word, based on the modification value, further includes:
identifying a first set of bits, within the first word, that corresponds to a first value;
decreasing, by the modification value, a respective amplitude of each bit, within the first set of bits, to create a first set of modified bits, where decreasing the respective amplitude causes the first set of modified bits to have a lower level of reliability than the first set of bits;

identifying a second set of bits, within the first word, that corresponds to a second value, the second value being different than the first value;

increasing, by the modification value, a respective amplitude of each bit, within the second set of bits, to create a second set of modified bits, where increasing the respective amplitude causes the second set of modified bits to have a lower level of reliability than the second set of bits; and generating the second version of the first word based on the first set of modified bits and the second set of modified bits.

20. The method of claim 18, where generating the modification value includes:

determining a difference between the quantity of errors and the error threshold; and generating the modification value based on the difference between the quantity of errors and the error threshold.

21. A device comprising:

a memory to store a block of words that are generated as a result of a one or more iterations associated with an error correction operation, where each word of the block of words, includes respective encoded bits and respective sets of reliability bits that identify a respective level of reliability of each one of the respective encoded bits; and one or more components to:

receive an instruction to perform an another iteration associated with the error correction operation, obtain, in response to the instruction, a first word, from the block of words, associated with a previous one of the one or more iterations, process the first word, to create one or more decoded versions of the first word, where measures of similarity, between the first word and the one or more decoded versions of the first word, are provided, select, as a second word, one of the one or more decoded versions of the first word associated with a highest one of the measures of similarity, determine a quantity of errors within the first word based on a comparison of the first word to the second word, determine whether the quantity of errors is greater than an error threshold, generate, based on the first word, a third word when the quantity of errors is not greater than the error threshold, where the third word includes a first set of bits, each having a first level of reliability that is greater than or equal to a second level of reliability associated with a corresponding one of a second set of bits within the first word, generate, based on the first word, a fourth word when the quantity of errors is greater than the error threshold, where the fourth word includes a third set of bits, each having a third level of reliability that is less than the second level of reliability associated with the corresponding one of the second set of bits, and output the third word or the fourth word based on whether the quantity of errors is greater than the error threshold.

22. The device of claim 21, where the one or more components are further to:

generate, based on the first word, a fifth word when the quantity of errors is approximately equal to the error threshold, where the fifth word includes a fourth set of bits, each having a fourth level of reliability that is approximately equal to the second level of reliability of the corresponding one of the second set of bits, and output the fifth word when the quantity of errors is approximately equal to the error threshold.

23. The device of claim 21, where, when generating the third word, the one or more components are further to:

increase amplitudes of a first portion of the second set of bits that correspond to a first value, decrease amplitudes of a second portion of the second set of bits that correspond to a second value, the second value being different than the first value, and generate the first set of bits based on the increased amplitudes of the first portion of the second set of bits and based on the decreased amplitudes of the second portion of the second set of bits.

24. The device of claim 21, where, when generating the fourth word, the one or more components are further to:

decrease, by a particular value, amplitudes of a first portion of the second set of bits that correspond to a first value, increase, by the particular value, amplitudes of a second portion of the second set of bits that correspond to a second value, the second value being different than the first value, and generate the third set of bits based on the decreased amplitudes of the first portion of the second set of bits and based on the increased amplitudes of the second portion of the second set of bits.

25. The device of claim 24, where the one or more components are further to:

determine the particular value based on a quantity of iterations, of the error correction operation, that have been performed on the block of words and based on a difference between the quantity of errors and the error threshold, invert one or more bits, of the first portion of the second set of bits, from the first value to the second value when the particular value is greater than a value threshold, and invert one or more bits, of the second portion of the second set of bits, from the second value to the first value when the particular value is greater than the value threshold.

* * * * *